(12) United States Patent
Kim

(10) Patent No.: US 8,362,692 B2
(45) Date of Patent: Jan. 29, 2013

(54) ORGANIC LIGHT EMITTING DISPLAY DEVICE

(75) Inventor: Eunah Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 321 days.

(21) Appl. No.: 12/195,930

(22) Filed: Aug. 21, 2008

(65) Prior Publication Data

US 2009/0206727 A1    Aug. 20, 2009

(30) Foreign Application Priority Data

Feb. 15, 2008  (KR) .................. 10-2008-0013748

(51) Int. Cl.
*H01J 1/62*       (2006.01)
*H01J 63/04*      (2006.01)
(52) U.S. Cl. ......... 313/504; 313/503; 313/506; 313/512
(58) Field of Classification Search ........... 313/498–512
See application file for complete search history.

(56) References Cited

U.S. PATENT DOCUMENTS

| | | | |
|---|---|---|---|
| 2003/0160564 A1* | 8/2003 | Park et al. ................... | 313/512 |
| 2005/0269941 A1* | 12/2005 | Kim et al. ................... | 313/503 |
| 2005/0275344 A1* | 12/2005 | Kim ............................. | 313/504 |
| 2006/0145602 A1* | 7/2006 | Yoo ............................. | 313/504 |
| 2006/0292362 A1* | 12/2006 | Hsu et al. ................... | 428/323 |
| 2007/0155158 A1* | 7/2007 | Gstrein et al. ............. | 438/618 |
| 2007/0293086 A1* | 12/2007 | Liu et al. ................... | 439/578 |

FOREIGN PATENT DOCUMENTS

| | | |
|---|---|---|
| KR | 2002-0054850 | 7/2002 |
| KR | 10-2005-0016018 | 2/2005 |
| KR | 10-0552968 | 2/2006 |
| KR | 10-0598716 | 4/2006 |
| KR | 10-2006-0053223 | 5/2006 |
| KR | 10-2006-0087885 | 8/2006 |
| KR | 10-2006-0104659 | 10/2006 |
| KR | 1020060113008 A | 11/2006 |
| KR | 1020070051619 A | 5/2007 |

OTHER PUBLICATIONS

Korean Office action dated Mar. 31, 2009, for corresponding Korean Patent Application No. 10-2008-0013748.
Byong C. Park, et al., "Bending of a Carbon Nanotube in Vacuum Using a Focused Ion Beam," Advanced Materials, 2006, v. 18, pp. 95-98.

(Continued)

*Primary Examiner* — Nimeshkumar Patel
*Assistant Examiner* — Thomas A Hollweg
(74) *Attorney, Agent, or Firm* — Christie, Parker & Hale, LLP

(57) ABSTRACT

An organic light emitting display device capable of displaying two images. The organic light emitting display device according to an embodiment of the present invention includes a first substrate including a plurality of pixel circuits and first organic light emitting diodes in a region defined by a plurality of data lines and scan lines, and a second substrate spaced from and facing the first substrate, the second substrate including second organic light emitting diodes. A pixel of the organic light emitting display device includes a corresponding one of the pixel circuits and a corresponding one of the first organic light emitting diodes and a corresponding one of the second organic light emitting diodes coupled to the pixel circuit.

12 Claims, 2 Drawing Sheets

OTHER PUBLICATIONS

Korean Office action dated Sep. 28, 2009, for priority Korean Patent Application No. 10-2008-0013748.
Corresponds to Korean Publication 10-2005-0029824, dated Mar. 29, 2005.
Corresponds to Korean Publication 10-2006-0032253, dated Apr. 17, 2006.

* cited by examiner

ORGANIC LIGHT EMITTING DISPLAY DEVICE

CROSS-REFERENCE TO RELATED APPLICATION

This application claims priority to and the benefit of Korean Patent Application No. 10-2008-0013748, filed on Feb. 15, 2008, in the Korean Intellectual Property Office, the entire content of which is incorporated herein by reference.

BACKGROUND

1. Field of the Invention

The present invention relates to an organic light emitting display device, and more particularly to an organic light emitting display device capable of displaying two images with one display unit.

2. Description of Related Art

In recent years, a variety of flat panel display devices have been developed with reduced weight and volume in comparison to a cathode ray tube (CRT) display. Some examples of the flat panel display devices include liquid crystal display (LCD), a field emission display (FED), a plasma display panel (PDP), an organic light emitting display, etc.

Among the various flat panel display devices, the organic light emitting display displays an image by using organic light emitting diodes (OLEDs) to emit light through the recombination of electrons and holes. The organic light emitting display has a rapid response time and low power consumption.

FIG. 1 is a schematic circuit diagram showing a pixel circuit of a conventional organic light emitting display device.

Referring to FIG. 1, a pixel 4 of the conventional organic light emitting display device includes an OLED and a pixel circuit 2 coupled to a data line (Dm) and a scan line (Sn) to control the OLED.

An anode electrode of the OLED is coupled to the pixel circuit 2, and a cathode electrode is coupled to a second power source (ELVSS). The OLED generates light with a luminance (e.g., a predetermined luminance) according to an electrical current supplied from the pixel circuit 2. The pixel circuit 2 controls the magnitude of the electrical current, which is supplied to the OLED, to correspond to a data signal supplied to the data line (Dm) when a scan signal is supplied to the scan line (Sn).

The pixel circuit 2 includes a second transistor (M2) coupled between a first power source (ELVDD) and the OLED, a first transistor (M1) coupled between the second transistor (M2) and the data line (Dm) and the scan line (Sn), and a storage capacitor (Cst) coupled between a gate electrode and a first electrode of the second transistor (M2).

A gate electrode of the first transistor (M1) is coupled to the scan line (Sn), a first electrode of the first transistor (M1) is coupled to the data line (Dm), and a second electrode of the first transistor (M1) is coupled to a terminal of the storage capacitor (Cst).

The first electrode of the first transistor (M1) or the second transistor (M2) can be a source electrode or a drain electrode, and the second electrode is different from the first electrode. For example, when the first electrode is a source electrode, the second electrode is a drain electrode, and vice versa. The first transistor (M1) coupled to the scan line (Sn) and the data line (Dm) is turned on when a scan signal is supplied to the scan line (Sn) to supply a data signal, which is supplied from the data line (Dm), to the storage capacitor (Cst). Thus, the storage capacitor (Cst) is charged with a voltage corresponding to the data signal.

The gate electrode of the second transistor (M2) is coupled to one terminal of the storage capacitor (Cst), and the first electrode of the second transistor (M2) is coupled to the other terminal of the storage capacitor (Cst) and the first power source (ELVDD). Further, a second electrode of the second transistor (M2) is coupled to the anode electrode of the OLED.

The second transistor (M2) controls the magnitude of an electrical current to correspond to a voltage value stored in the storage capacitor (Cst), and the electrical current flows from the first power source (ELVDD) to the second power source (ELVSS) via the OLED. The OLED generates light corresponding to the magnitude of the electrical current supplied from the second transistor (M2).

However, the pixel 4 in a conventional organic light emitting display device is coupled to only one OLED. Therefore, the conventional organic light emitting display device has a display unit that includes a plurality of the pixels 4 can only display one image expressed on one surface thereof.

SUMMARY OF THE INVENTION

Accordingly, embodiments of the present invention provide an organic light emitting display device capable of displaying a pair of images respectively on two surfaces thereof. Each pixel of the organic light emitting display device includes a pair of OLEDs respectively formed on the two surfaces.

One embodiment of the present invention provides an organic light emitting display device. The organic light emitting display device includes a first substrate including a plurality of pixel circuits and first organic light emitting diodes in a region defined by a plurality of data lines and scan lines; a second substrate spaced from and facing the first substrate, the second substrate including second light emitting diodes. Each pixel among a plurality of pixels of the organic light emitting display device includes a corresponding one of the pixel circuits and a corresponding one of the first organic light emitting diodes and a corresponding one of the second organic light emitting diodes coupled to the pixel circuit.

The first organic light emitting diodes on the first substrate may form a first display unit for displaying an image on a first surface thereof, and the second organic light emitting diodes on the second substrate may form a second display unit for displaying an image on a second surface thereof.

Also, the second organic light emitting diodes may be electrically coupled to the pixel circuits through conductive coupling units, and the coupling units may have an elongated shape and extend between the first substrate and the second substrate. The coupling units may include carbon nanotube bundles or conductive barrier ribs.

Another embodiment according to the present invention provides an organic light emitting display device including a first substrate including a first display unit for displaying a first image; a second substrate spaced from and facing the first substrate and including a second display unit for displaying a second image; and a plurality of pixel circuits on the first substrate. The plurality of pixel circuits are coupled to the first display unit and the second display unit. The first display unit may include a plurality of first organic light emitting diodes coupled to the plurality of pixel circuits. The second display unit may include a plurality of second organic light emitting diodes coupled to the plurality of pixel circuits. The second organic light emitting diodes may be electrically coupled to the plurality of pixel circuits through conductive coupling units. Each of the coupling units may have an elongated shape and extend between the first substrate and the second substrate. The coupling units may include carbon nanotube bundles or conductive barrier ribs.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF EXEMPLARY EMBODIMENTS

Figure 1:
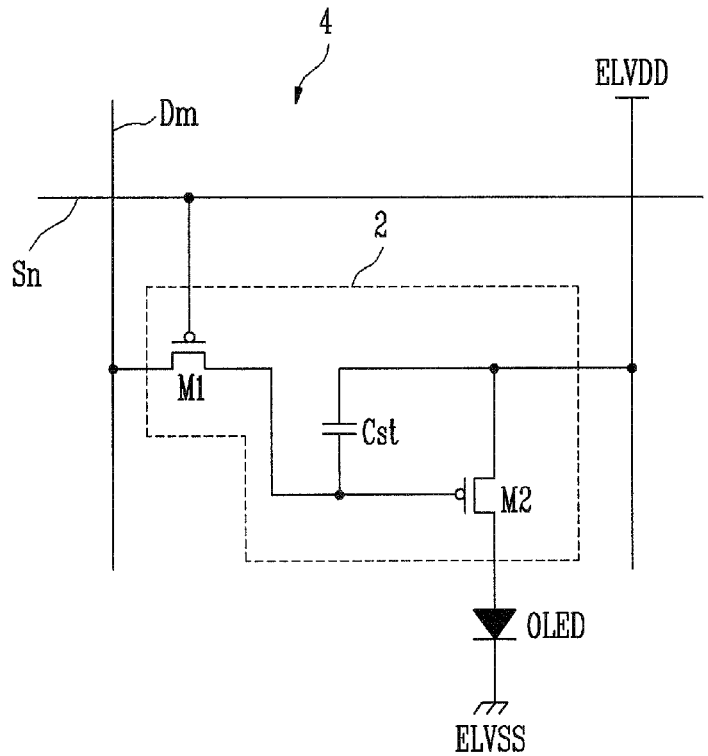
FIG. 1 is a schematic circuit diagram showing a pixel of a conventional organic light emitting display device.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the element or be indirectly on the element with one or more intervening elements interposed therebetween. Also, when an element is referred to as being "connected to" another element, it can be directly connected to the element or be indirectly connected to the element with one or more intervening elements interposed therebetween. Furthermore, when a first element is described as being coupled to a second element, the first element may be directly coupled to the second element or may be indirectly coupled to the second element via a third element. Hereinafter, like reference numerals refer to like elements.

Figure 2:
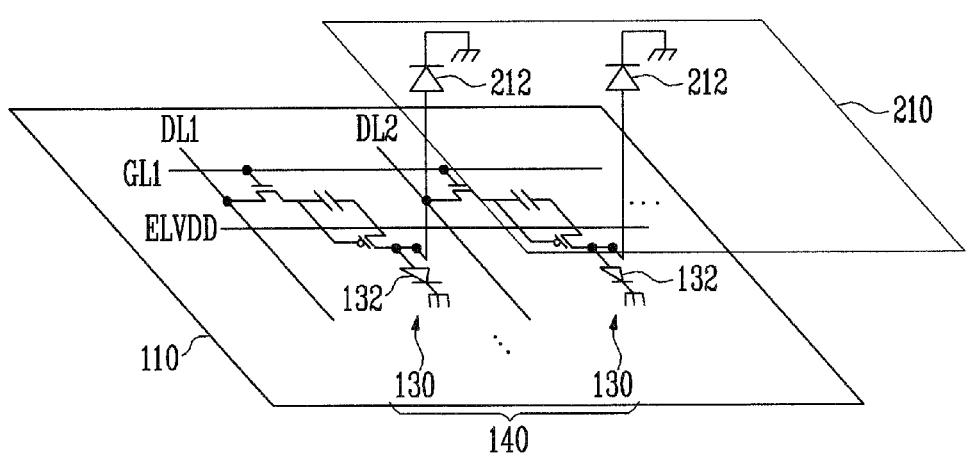
FIG. 2 is a schematic diagram showing a schematic configuration of an organic light emitting display device according to an exemplary embodiment of the present invention.

FIG. 2 is a schematic diagram showing a schematic configuration of an organic light emitting display device 100 according to an exemplary embodiment of the present invention.

Referring to FIG. 2, in the organic light emitting display device 100 according to an exemplary embodiment of the present invention, a plurality of pixels 130 are formed in a region defined by a plurality of data lines (e.g., DL1, DL2), scan lines (e.g., GL1) and first power source lines (e.g., ELVDD), all of which are formed on the first substrate 110. A display unit 140 includes a plurality of pixels 130.

Here, according to an embodiment, each of the pixels 130 includes first and second OLEDs 132 and 212, which are formed on different substrates. For example, the first OLEDs 132 are formed on the first substrate 110, and the second OLEDs 212 are formed on the second substrate 210.

That is to say, the pixels 130 of a pixel unit 140 include pixel circuits 134 formed on the first substrate 110 and the first OLEDs 132 that form a first display unit for displaying image on a first surface thereof. The pixels 130 also include the second OLEDs 212 that form a second display unit for displaying image on a second surface thereof. The second OLEDs 212 are also driven by the pixel circuits 134 on the first substrate 110.

As the second OLEDs 212 constituting the second display unit are not formed on the same flat surface as the pixels circuits 134 and the first OLEDs 132 that constitute the display unit 140, a coupling unit (not shown) formed of, for example, a conductive carbon nanotube bundle or a barrier rib may be used to couple the second OLEDs 212 and the rest of the display unit 140 (e.g., the pixel circuits 134) to each other.

Figure 3:
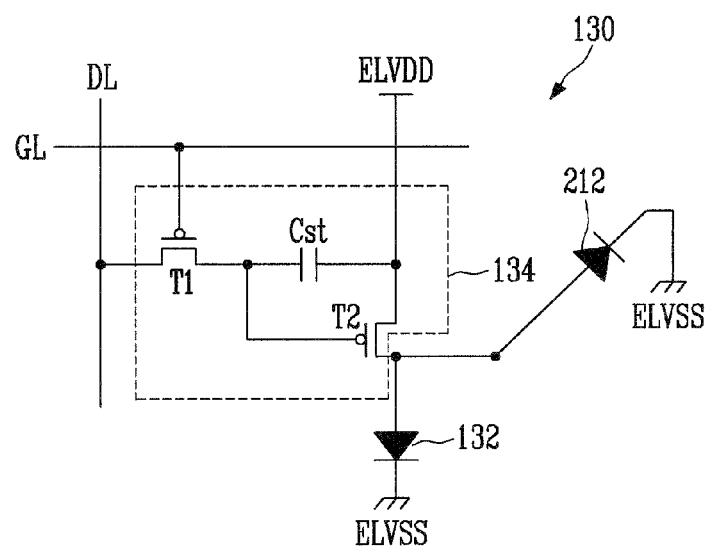
FIG. 3 is a schematic circuit diagram showing a pixel of the organic light emitting display device according to an exemplary embodiment of the present invention as shown in FIG. 2.

FIG. 3 is a schematic circuit diagram showing a pixel 130 of the organic light emitting display device according to an exemplary embodiment of the present invention shown in FIG. 2.

Referring to FIG. 3, the pixel 130 of the organic light emitting display device according to an exemplary embodiment of the present invention includes a pixel circuit 134 coupled to a data line (DL) and a scan line (GL) to control the first and second OLEDs 132 and 212 that are coupled to the pixel circuit 134. Those skilled in the art would appreciate that the organic light emitting display includes a plurality of pixels 130 arranged in rows and columns coupled to respective data lines and scan lines.

According to the embodiment of the present invention, each of the pixels 130 includes the pixel circuit 134 and the two OLEDs 132 and 212 that are coupled to the pixel circuit 134.

The anode electrodes of the first and second OLEDs 132 and 212 are coupled to the pixel circuit 134, and the cathode electrodes of the first and second OLEDs 132 and 212 are coupled to the second power source (ELVSS). The first and second OLEDs 132 and 212 generate light with a luminance (e.g., a predetermined luminance) according to an electrical current supplied from the pixel circuit 134.

According to the embodiment, the first OLEDs 132 are formed on the first substrate 110 (see FIG. 2), and the second OLEDs 212 are formed on the second substrate 210 (see FIG. 2). Here, the first OLEDs 132 formed on the first substrate 110 form a first display unit for displaying an image on a first surface thereof. The second OLEDs 212 formed on the second substrate 210 form a second display unit for displaying an image on a second surface thereof.

The pixel circuit 134 controls the magnitude of an electrical current supplied to the first and second OLEDs 132 and 212 to correspond to the data signal supplied to the data line (DL) when a scan signal is supplied to the scan line (GL).

The pixel circuit 134 includes a second transistor (T2) as a drive transistor coupled between a first power source (ELVDD) and the first and second OLEDs 132 and 212, a first transistor (T1) coupled between the second transistor (T2) and the data line (DL) and the scan line (GL), and a storage capacitor (Cst) coupled between a gate electrode and a first electrode of the second transistor (T2).

A gate electrode of the first transistor (T1) is coupled to the scan line (GL), and a first electrode of the first transistor (T1) is coupled to the data line (DL). A second electrode of the first transistor (T1) is coupled to a terminal of the storage capacitor (Cst).

Here, the first electrode of the first transistor (T1) or the second transistor (T2) can be either a source electrode or a drain electrode, and the second electrode of the first transistor (T1) or the second transistor (T2) is the other one of the source electrode or the drain electrode. For example, when the first electrode is a source electrode, the second electrode is a drain electrode, and vice versa. The first transistor (T1) coupled to the scan line (GL) and the data line (DL) is turned on when a scan signal is supplied to the scan line (GL) to supply a data signal, which is supplied from the data line (DL), to the storage capacitor (Cst). Thus, the storage capacitor (Cst) is charged with a voltage corresponding to the data signal.

A gate electrode of the second transistor (T2) is coupled to a terminal of the storage capacitor (Cst), and a first electrode of the second transistor (T2) is coupled to another terminal of the storage capacitor (Cst) and the first power source (ELVDD). A second electrode of the second transistor (T2) is coupled to the anode electrodes of the first and second OLEDs 132 and 212.

The second transistor (T2) controls the magnitude of an electrical current to correspond to a voltage value stored in the storage capacitor (Cst), and the electrical current capacity flows from the first power source (ELVDD) to the second power source (ELVSS) via the first OLED 132 and/or the second OLED 212. Thus, the first OLED 132 and the second OLED 212 generate light corresponding to the magnitude of the electrical current supplied from the second transistor (T2).

Here, each of the pixels 130 provided in the organic light emitting display device 100 according to an exemplary embodiment of the present invention shown in FIG. 2 includes a pixel circuit 134 and the first and second OLEDs 132 and 212 coupled to the pixel circuit 134. Also, the first OLEDs 132 are formed on the first substrate 110, and the second OLEDs 212 are formed on the second substrate 210. Therefore, the first OLEDs 132 formed on the first substrate 110 form a first display unit for displaying an image on a first surface thereof, and the second OLEDs 212 formed on the second substrate 210 form a second display unit for displaying an image on a second surface thereof.

Here, the second OLEDs 212 constituting the second display unit are not formed on the same flat surface as the pixel circuits 134 and the first OLEDs 132 of the display unit 140. Therefore, a coupling unit (not shown in FIG. 3) formed of, for example, a conductive carbon nanotube bundle or a barrier rib may be used to couple the second OLEDs 212 and the respective pixel circuits 134 to each other.

Figure 4:
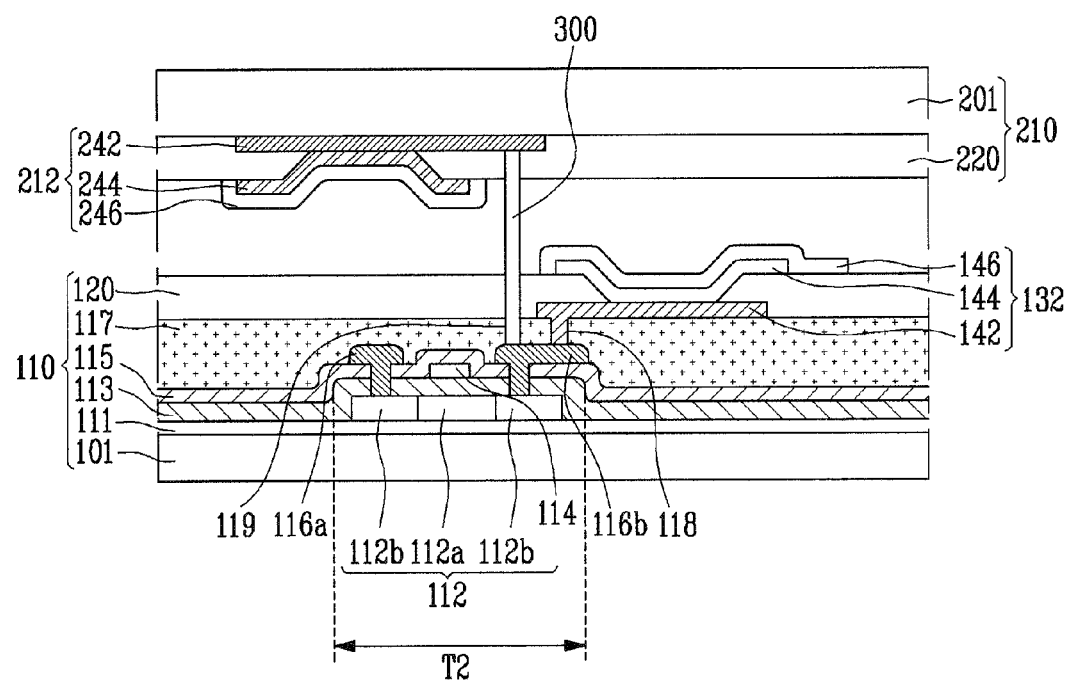
FIG. 4 is a cross-sectional view showing one region of the pixel in the organic light emitting display device according to an exemplary embodiment of the present invention as shown in FIG. 2.

FIG. 4 is cross-sectional view showing a region of the pixel 130 in the organic light emitting display device 100 according to an exemplary embodiment of the present invention shown in FIG. 2. Here, FIG. 4 shows the structures of a drive transistor in each of the pixels 130 of the organic light emitting display device 100 and the first and second OLEDs 132, 212 coupled to the drive transistor.

Referring to FIG. 4, each of the pixels 130 in the organic light emitting display device 100 according to an exemplary embodiment of the present invention includes the first substrate 110 having a second transistor (T2) (e.g., a drive transistor) and the OLED 132 formed therein, and a second substrate 210 electrically coupled to the second transistor (T2) through a coupling unit 300 and having the second OLED 212 formed therein.

The first substrate 110 includes a deposition substrate 101 and the pixels 130 formed on the deposition substrate 101. The second substrate 210 includes a transparent substrate 201 and the second OLED 212 formed on the transparent substrate 201.

Each of the pixels 130 includes the pixel circuit 134 and the OLEDs 132 and 212, as previously illustrated in FIG. 3, and FIG. 4 shows a cross sectional view of the second transistor (T2) in the pixel circuit 134 and the OLEDs 132 and 212 coupled to the second transistor (T2)

First, a buffer layer 111 is formed on the deposition substrate 101. The deposition substrate 101 is formed of, for example, glass and the like material, and the buffer layer 111 is formed of insulator materials such as silicon oxide ($SiO_2$) or silicon nitride (SiNx). The buffer layer 111 prevents the deposition substrate 101 from being damaged by factors such as external heat, etc.

A semiconductor layer 112 including an active layer 112a and a source and drain region 112b is formed on at least a region of the buffer layer 111.

A gate insulator layer 113 is formed on the buffer layer 111 and the semiconductor layer 112, and a gate electrode 114 having a size corresponding to the width of the active layer 112a is formed on a region of the gate insulator layer 113.

An interlayer dielectric layer 115 is formed on the gate insulator layer 113 and the gate electrode 114, and source and drain electrodes 116a and 116b are formed on a region (e.g., a predetermined region) of the interlayer dielectric layer 115.

The source and drain electrodes 116a and 116b are coupled to an exposed region of the source and drain region 112b, and a planarization layer 117 is formed on the interlayer dielectric layer 115 and the source and drain electrodes 116a and 116b.

The semiconductor layer 112 and the source and drain electrodes 116a and 116b form the above-mentioned second transistor (T2).

Also, first and second via holes 118 and 119 are formed on the planarization layer 117.

The first via hole 118 allows a first electrode 142 of the first OLED 132 formed on a region of the planarization layer 117 to be coupled to at least one exposed region of the source electrode 116a or the drain electrode 116b.

In addition, the second via hole 119 allows a first electrode 242 of the second OLED 212 formed on a region of the second substrate 210 to be coupled to at least one exposed region of the source electrode 116a or the drain electrode 116b.

The coupling unit 300, which is formed in a vertical shape (i.e., elongated shape) between the first substrate 110 and the second substrate 210 as shown in FIG. 4, is used to electrically couple the first electrode 242 of the second OLED 212 to either the source electrode 116a or the drain electrode 116b.

As an example, a carbon nanotube bundle may be used as the coupling unit 300. That is, one end of the carbon nanotube bundle is electrically coupled to the first electrode 242 of the second OLED 212, which is formed on the second substrate 210 Another end of the carbon nanotube bundle is coupled to the source electrode 116a or the drain electrode 116b via the second via hole 119 in a vertical direction.

A method for accurately positioning a carbon nanotube in a desired direction within several seconds may be accomplished by using a focused ion beam after the formation of the carbon nanotube as disclosed in the *Bending of carbon nanotube in vacuum using a focused ion beam*, Byong Chon Park, Ki Young Jung, Won Young Song, Beom-hoan O, Sang Jung Ahn, Advanced Materials, Vol. 18, page 95-98, 2006. The entire content of which is hereby incorporated by reference.

Also, the coupling unit 300 may be a barrier rib formed of conductive materials.

In addition, a first pixel definition layer 120 is formed on the planarization layer 117 and the first electrode 142 of the first OLED 132, and the first pixel definition layer 120 has an opening for exposing at least one region of the first electrode 142.

In the same manner, a second pixel definition layer 220 is formed on the transparent substrate 201 and the first electrode 242 of the second OLED 212, and the second pixel definition layer 220 has an opening for exposing at least one region of the first electrode 242.

Here, a position in which the first pixel definition layer 120 and the second pixel definition layer 220 are formed may be varied according to various embodiments of the present invention.

Furthermore, organic layers 144 and 244 are formed on openings of the first and second pixel definition layers 120 and 220, respectively. Second electrode layers 146 and 246 are formed respectively on the pixel definition layers 120 and 220 and the organic layers 144 and 244.

That is, the first OLED 132 is formed on the first substrate 110 and then coupled to a source electrode 116a or a drain electrode 116b of the second transistor (T2) through the first via hole 118. The second OLED 212 is formed on the second substrate 210 to be coupled to the source electrode 116a or the drain electrode 116b of the second transistor (T2) (drive transistor) through the coupling unit 300 and the second via hole 119.

As described above, an organic light emitting display device according to the embodiments of the present invention may display a pair of images on two surfaces thereof since one display unit is configured to display images on two different flat surfaces. Also, the organic light emitting display device according to the embodiments of the present invention may improve its life time by preventing an image burn-in phenomenon from occurring in one of the pair of images when the other image is used to display a still image.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display device comprising:
a first substrate comprising a plurality of pixel circuits and first organic light emitting diodes in a region defined by a plurality of data lines and scan lines;
a second substrate spaced from and facing the first substrate, the second substrate comprising a pixel definition layer and second organic light emitting diodes at openings of the pixel definition layer, the second organic light emitting diodes being in contact with the pixel definition layer,
wherein each pixel among a plurality of pixels of the organic light emitting display device comprises a corresponding one of the pixel circuits and a corresponding one of the first organic light emitting diodes and a corresponding one of the second organic light emitting diodes coupled to the corresponding one of the pixel circuits; and
a conductive coupling unit electrically coupling the corresponding one of the pixel circuits to the corresponding one of the second organic light emitting diodes, the conductive coupling unit extending between the first substrate and the second substrate, and comprising a carbon nanotube bundle,
wherein an entire organic layer of the corresponding one of the second organic light emitting diodes and an entire organic layer of the corresponding one of the first organic light emitting diodes are respectively located on opposite lateral sides of the conductive coupling unit.

2. The organic light emitting display device according to claim 1, wherein the first organic light emitting diodes on the first substrate form a first display unit for displaying an image on a first surface thereof.

3. The organic light emitting display device according to claim 1, wherein the second organic light emitting diodes on the second substrate form a second display unit for displaying an image on a second surface thereof.

4. The organic light emitting display device according to claim 1, wherein the second organic light emitting diodes are electrically coupled to the pixel circuits through the conductive coupling units.

5. The organic light emitting display device according to claim 4, wherein each of the coupling units has an elongated shape and extends between the first substrate and the second substrate.

6. The organic light emitting display device according to claim 4, wherein the coupling units comprise conductive barrier ribs.

7. The organic light emitting display device according to claim 1,
wherein the corresponding one of the second organic light emitting diodes comprises an electrode located between the second substrate and the organic layer, and
wherein the conductive coupling unit is connected to the electrode of the corresponding one of the second organic light emitting diodes.

8. An organic light emitting display device comprising:
a first substrate comprising a first display unit having a plurality of first organic light emitting diodes for displaying a first image;
a second substrate spaced from and facing the first substrate and comprising a second display unit having a plurality of second organic light emitting diodes for displaying a second image, the plurality of second organic light emitting diodes being at openings of a pixel definition layer on the second substrate, the second organic light emitting diodes being in contact with the pixel definition layer;
a plurality of pixel circuits on the first substrate, the plurality of pixel circuits coupled to the first display unit and the second display unit,
wherein the plurality of first organic light emitting diodes are respectively coupled to the plurality of pixel circuits and the plurality of second organic light emitting diodes are respectively coupled to the plurality of pixel circuits; and
a conductive coupling unit electrically coupling a corresponding one of the pixel circuits to a corresponding one of the second organic light emitting diodes, the conductive coupling unit extending between the first substrate and the second substrate, and comprising a carbon nanotube bundle.
wherein an entire organic layer of the corresponding one of the second organic light emitting diodes and an entire organic layer of a corresponding one of the first organic light emitting diodes are respectively located on opposite lateral sides of the conductive coupling unit.

9. The organic light emitting display device according to claim 8, wherein the second organic light emitting diodes are electrically coupled to the plurality of pixel circuits through conductive coupling units.

10. The organic light emitting display device according to claim 9, wherein each of the coupling units has an elongated shape and extends between the first substrate and the second substrate.

11. The organic light emitting display device according to claim 9, wherein the coupling units comprise conductive barrier ribs.

12. An organic light emitting display device comprising:
a first substrate comprising a plurality of pixel circuits and first organic light emitting diodes in a region defined by a plurality of data lines and scan lines; and
a second substrate spaced from and facing the first substrate, the second substrate comprising a pixel definition layer and second organic light emitting diodes at openings of the pixel definition layer, the second organic light emitting diodes being in contact with the pixel definition layer,
wherein each pixel among a plurality of pixels of the organic light emitting display device comprises a corresponding one of the pixel circuits and a corresponding one of the first organic light emitting diodes and a corresponding one of the second organic light emitting diodes coupled to the corresponding one of the pixel circuits,
wherein the second organic light emitting diodes are electrically coupled to the pixel circuits through conductive coupling units, and each of the conductive coupling units has an elongated shape with a substantially constant width and extends between the first substrate and the second substrate, and comprises a carbon nanotube bundle, and
wherein an entire organic layer of the corresponding one of the second organic light emitting diodes and an entire organic layer of the corresponding one of the first organic light emitting diodes are respectively located on opposite lateral sides of a corresponding one of the conductive coupling units.

* * * * *